United States Patent
Froundlich et al.

(10) Patent No.: US 6,559,644 B2
(45) Date of Patent: May 6, 2003

(54) MRI-BASED TEMPERATURE MAPPING WITH ERROR COMPENSATION

(75) Inventors: David Froundlich, Haifa (IL); Yerucham Shapira, Rehovot (IL)

(73) Assignee: InSightec - TxSonics Ltd., Tirat Carmel (IL)

(*) Notice: Subject to any disclaimer, the term of this patent is extended or adjusted under 35 U.S.C. 154(b) by 0 days.

(21) Appl. No.: 09/871,464

(22) Filed: May 30, 2001

(65) Prior Publication Data

US 2002/0180438 A1 Dec. 5, 2002

(51) Int. Cl.[7] .................................................. G01V 3/00
(52) U.S. Cl. ...................................... 324/315; 324/306
(58) Field of Search ............................. 324/315, 306, 324/307, 309, 300; 600/410, 412

(56) References Cited

U.S. PATENT DOCUMENTS

| | | | | |
|---|---|---|---|---|
| 5,378,987 A | * | 1/1995 | Ishihara et al. | 324/315 |
| 5,492,122 A | * | 2/1996 | Button et al. | 324/315 |
| 5,711,300 A | | 1/1998 | Schneider et al. | |
| 6,067,371 A | * | 5/2000 | Gouge et al. | 382/128 |
| 6,194,899 B1 | * | 2/2001 | Ishihara et al. | 324/315 |

FOREIGN PATENT DOCUMENTS

WO       WO 99 21024 A       4/1999

OTHER PUBLICATIONS

McDannold, et al. "MRI Evaluation of Thermal Ablation of Tumors with Focused Ultrasound." JMRI 1998; 8:91–100.
Ishihara, et al. "A Precise and Fast Temperature Measurement using Water Proton Chemical Shift." Magn Reson Med 1195; 34:814–823.
Hynynen, et al. "Principles of MR–Guided Focused Ultrasound"; International MRI, Robert B. Lufkin MOSBY Chapter 25:237–243.
R.D. Peters, R.M. Henkelman, "Proton–Resonance Frequency Shift MR Thermometry is Affected by Changes in the Electrical Conductivity of Tissue"; Magnetic Resonance in Medicine, vol. 43, 2000 pp. 62–71.
J. De Poorter , et al, "The Proton–Resonance–Frequency–Shift Method Compared with Molecular Diffusion for Quantitative Measurement of Two–Dimensional Time–Dependent Temperature Distribution in a Phatom"; Journal of Magnetic Resonance, Series B, vol. 103, 1194, pp. 234–241.

* cited by examiner

Primary Examiner—Louis Arana
(74) Attorney, Agent, or Firm—Bingham McCutchen LLP

(57) ABSTRACT

Magnetic resonance temperature change monitoring of a heated portion of a tissue mass undergoing thermal treatment is more accurately accomplished by compensating for false temperature change measurements caused by movement of the mass and/or temporal changes of the magnetic field during the thermal MR Imaging, wherein the compensation is based on subtracting out "apparent temperature change" measurements of one or more unheated portions of the tissue mass located in a neighborhood of the heated portion, which form a temperature bias map of the tissue mass region.

34 Claims, 2 Drawing Sheets

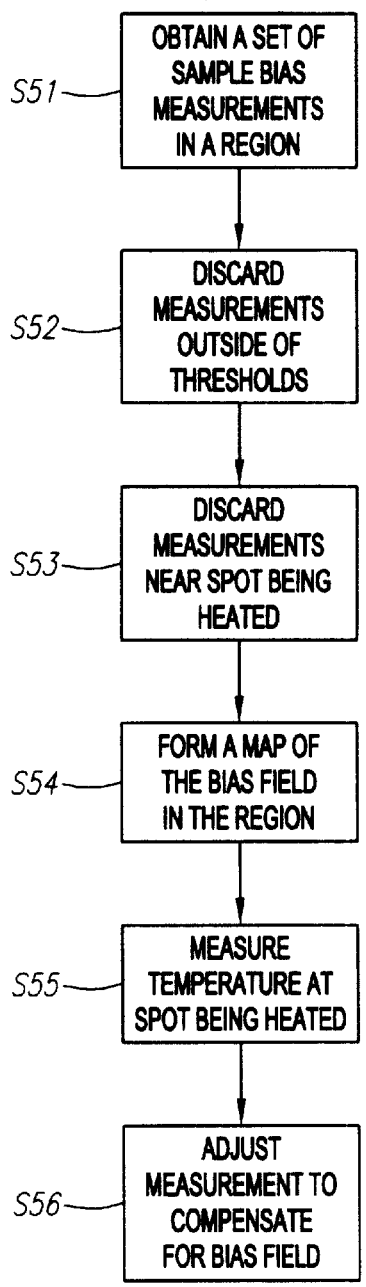
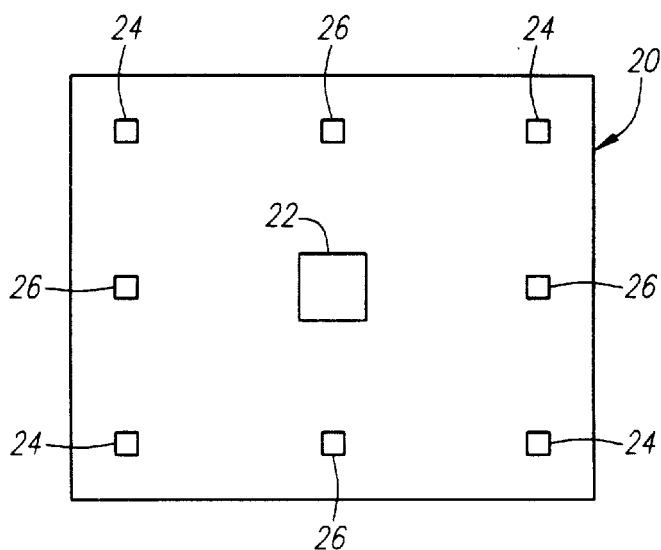
FIG. 3
FIG. 4

MRI-BASED TEMPERATURE MAPPING WITH ERROR COMPENSATION

BACKGROUND OF THE INVENTION

1. Field of the Invention

The present invention relates generally to systems and methods for imaging tissue using magnetic resonance imaging (MRI) techniques, and more particularly to obtaining high accuracy temperature measurements of a tissue mass being heated by compensating for errors caused by motion of the tissue mass and/or dynamic changes in magnetic field intensity or uniformity during the acquisition of MR images used for temperature measurement.

2. Background

Certain types of tissues, such as cancerous tumors, can be destroyed by heat. One conventional way to heat these tissues is by directing laser energy into the tissue using, e.g., a laser source carried by a catheter. Another conventional way is to focus high intensity, ultrasonic acoustic waves into the tissue using, e.g., a phased-array of piezoelectric transducers. Both of these approaches can reduce or even eliminate the need for invasive surgery to remove the tissue.

Of critical importance to the process is verifying that a sufficient temperature was reached during each application of ultrasonic energy to kill the target tissue structure, or portion thereof being heated. This can be done by measuring the temperature change (rise) of the portion of the tissue structure being heated during the heating process using MR imaging techniques.

One known method of measuring temperature change using MR techniques exploits the temperature dependence of the proton resonant frequency (PRF) in water. The temperature dependence of the PRF is primarily due to temperature-induced induced rupture, stretching, or bending of the hydrogen bonds in water. The temperature dependence of pure water is 0.0107 ppm/° C., and the temperature dependence of other water-based tissues is close to this value.

Because of a non-homogenous magnetic field within the MRI machine, absolute PRF measurements are not possible. Instead, changes in PRF are measured by first taking a MR image before the delivery of heat, and subtracting this baseline value from subsequent measurements. Notably, the total imaging time must be kept relatively short for the baseline value to remain relatively stable, since drifts in the magnetic field can occur over time.

The temperature-induced changes in PRF are then estimated by measuring changes in phase of the MR signal, or frequency shift in certain MR imaging sequences. Unfortunately, movements of the object being imaged or dynamic changes in magnetic field intensity and/or uniformity during the MR imaging process (i.e., between successively acquired images) can also induce phase shifts, which can be misinterpreted as a temperature-induced phase shift. As a result, a given phase shift might be attributable to any one of temperature change, motion, changes in magnetic field, or some combination thereof, between acquired images. This ambiguity makes it difficult to determine the tissue mass temperature change relying only on the MR signals from the tissue mass being heated. Such motion and non-uniform field "distortion" may have differing sources acting alone or in combination, such as patient motion, breathing or other dynamic organ movement (e.g., the heart), or blood moving through a blood vessel located in or adjacent to the target tissue region.

SUMMARY OF THE INVENTION

In accordance with a general aspect of the invention, MR temperature change monitoring of a heated portion of a tissue mass undergoing thermal treatment is adjusted to compensate apparent temperature change measurements caused by movement of the mass and/or changes in magnetic field between acquisition of MR images by subtracting out similar apparent temperature change measurements made of one or more unheated portions of the tissue mass located in a neighborhood of the heated portion, which form a temperature bias map of the tissue mass region.

One implementation of the invention is a system and method for determining a change in temperature of a heated portion of a mass using magnetic resonance imaging techniques.

In one embodiment, the system and method include measuring an apparent change in temperature of the heated portion of the mass; measuring an apparent change in temperature of an unheated portion of the mass located in a neighborhood of the heated portion; and adjusting the measured apparent change in temperature of the heated portion based at least in part on the measured apparent change in temperature of the unheated portion.

In one embodiment, the apparent change in temperatures of the respective heated and unheated portions of the mass are determined by measuring a characteristic related to temperature both before and after the heated portion is heated, and then deriving a temperature change based on a change in the measured characteristic. By way of non-limiting example, the measured characteristic may be the phase of an electromagnetic signal emitted from the respective portion, wherein the apparent temperature change is derived from a phase shift in the signal.

In order to increase accuracy of the temperature change measurement, the apparent change in temperatures of multiple unheated portions of the mass in the neighborhood of the heated portion may be used to more precisely identify the temperature bias field in the area of the heated portion. In order to reduce effects in the apparent temperature changes of unheated portions directly adjacent to the heated portion caused by some thermal energy transfer, the relative locations of the unheated portions with respect to the heated portion may also be taken into account.

Other aspects and features of the invention will become apparent in view of the disclosed and described preferred embodiments.

BRIEF DESCRIPTION OF THE DRAWINGS

The Figures illustrate both the design and utility of preferred embodiments of the invention, wherein

FIG. 3 is a flowchart of a preferred process for determining the temperature change of a heated portion of a tissue mass by adjusting for errors due to the temperature bias field surrounding the heated portion.

FIG. 4 is a diagram of a specific portion that is being heated in the tissue mass, as well as the neighborhood region surrounding the heated portion.

DETAILED DESCRIPTION OF THE PREFERRED EMBODIMENTS

Aspects and features of the invention will now be described with respect to magnetic resonance imaging techniques employing phase shift based temperature change measurements, i.e., relying on PRF shift. As will be apparent to those skilled in the art, the aspects, concepts and features of the invention are equally applicable to other magnetic resonance temperature change imaging techniques. Thus, the invention is not to be limited to PRF shift embodiments unless explicit limitations stating as much are included in the particular claim language.

The term "neighborhood" is used herein to describe a geographic area, such as, e.g., a given array size of pixels in a magnetic resonance image. The term is to be broadly construed and no limitation as to the size of an area that can be considered a "neighborhood" is made. Where a first object is said to be "in the neighborhood" of a second object, it means only that the first object is located in a general vicinity of the second object, but not necessarily directly touching, adjacent, or even close to the second object, although being "in the neighborhood" includes such possibilities.

The term "apparent" is used herein to modify or describe a measured temperature change when magnetic resonance imaging of an object would indicate that the object has changed in temperature over a period of time, e.g., as indicated by a PRF shift. Because the indicated temperature change may in fact be partially or even completely a result of a temperature bias field, i.e., the actual temperature of the object may not have changed, or least not to the same extent indicated by the imaging result, the change is said to be "apparent." Notably, the use of "apparent" does not preclude the possibility that the measured temperature change is correct or substantially correct. Thus, the term "apparent" is not limiting, but is used only to more clearly identify where it is uncertain if an error is present in a temperature change measurement.

In accordance with a general aspect of the invention, it has been observed that PRF shift measurements are affected by a bias temperature field that may be related to subject motion and/or to irregularities of the time variation of the MRI magnetic field. The variation of this bias temperature field is generally approximately linear in a given local neighborhood of an MR image, e.g. in a 100×100 block of pixels, of a portion, or "spot," being heated in tissue mass.

Figure 1:
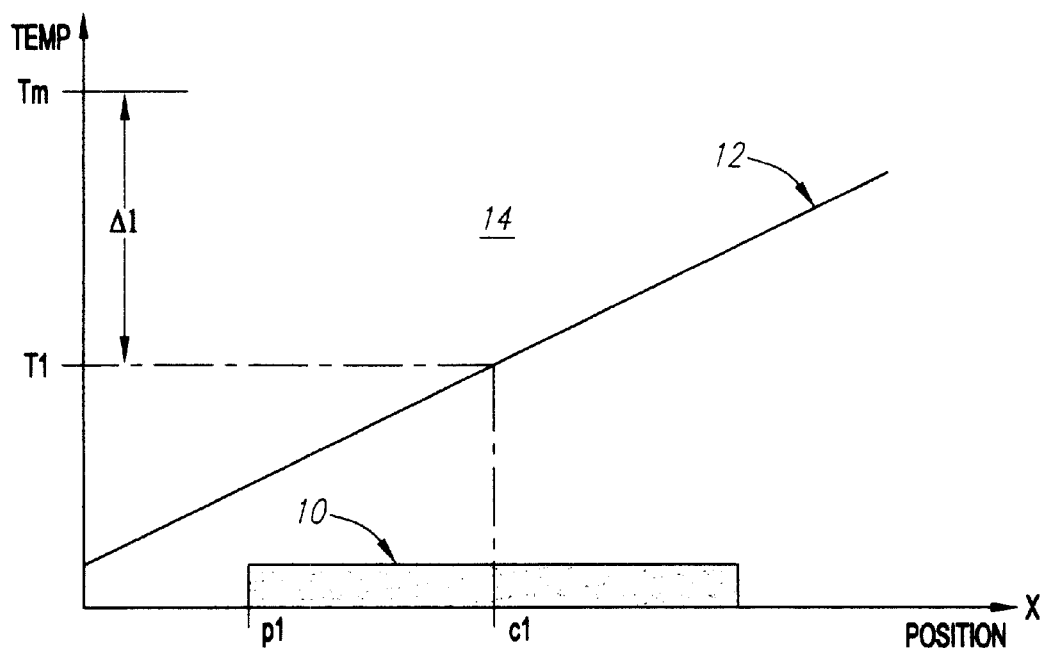
FIG. 1 is a graph depicting a temperature bias field in a region of a tissue mass being treated, with the heated portion of the mass located at a first position in a temperature bias field.
Figure 2:
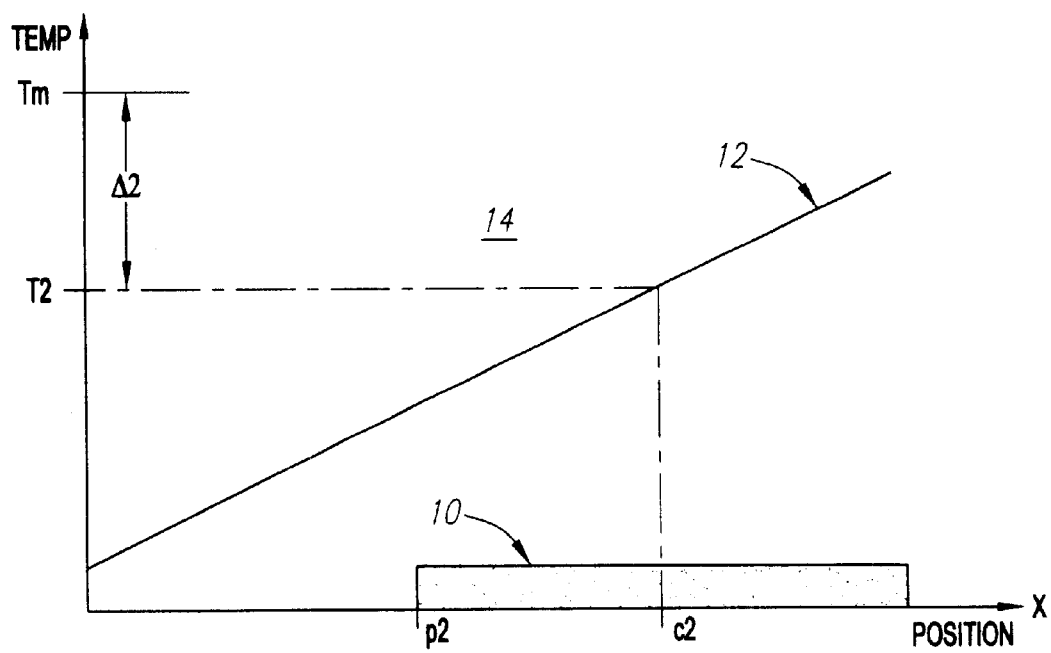
FIG. 2 is a graph depicting a temperature bias field in a region of a tissue mass being treated, with the heated portion of the mass located at a second position in the temperature bias field.

For purposes of illustration, FIGS. 1 and 2 depict bias temperature field 12 that is a function of relative position along the x-axis of a magnetic resonance image 14 of a tissue mass region. The bias temperature field 12 may also depend on position along the y-axis of the image, but that dependence is not depicted in the figures for ease in illustration. In particular, the bias temperature field 12 (which is shown as approximately linear) represents the amount of "apparent" temperature change that will be indicated as a PRF shift between a first image and a second (later) image of the tissue mass that is not due to an actual change in temperature, but instead is due to motion and/or to irregularities of the time variation of the MRI magnetic field. Because of this bias temperature field 12, phase-based temperature change measurements for a portion 10 of the tissue region being heated will contain a bias error that is position dependent. In other words, the amount of bias error in a temperature change measurement is a function of where the heated portion 10 is located in the bias temperature field 12.

For example, as seen in FIG. 1, when the heated portion 10 is located at position p1 along the x-axis, the bias error corresponding to the center c1 of the heated portion will be T1. But when the heated portion 10 is located at a position p2 (to the right of position p1 along the x-axis, as seen in FIG. 2), the bias error corresponding to the center c2 of the mass 10 will be T2. As a result, when a temperature change measurement Tm is obtained, it will correspond to a temperature rise of $\Delta 1$ if the center of the heated portion 10 is located at position c1, $\Delta 2$ if the center of the heated portion 10 is located at position c2, or somewhere between $\Delta 1$ and $\Delta 2$ if the center of the heated portion 10 is located somewhere between positions c1 and c2.

It will be appreciated by those skilled in the art that while the bias temperature field in FIGS. 1 and 2 is depicted as two dimensional and linear for ease in illustration, in reality the field may vary in three dimensional space and may not be linear or planar along either of the x axis or y axis. Further, it will be appreciated that measuring the bias error at the center of the heated portion is an approximation, and that the actual bias error is more accurately represented as an integral of the three dimensional volume defined by the boundaries of the heated portion of the tissue region. Thus, the bias error introduced in the heated portion is a function of both the x and y position of a particular point in the heated portion of the tissue mass.

With this observation in mind, a general aspect of the invention is to employ as part of the MR temperature change monitoring during a thermal treatment a process which compensates for the effects of the bias temperature field. One embodiment of such a process is depicted in FIG. 3.

With reference to FIG. 3, it will be observed that the purpose of steps S51–S54, taken together, is to determine the nature of the bias temperature field in a MR image region that contains a tissue mass being heated. Once the nature of the bias temperature field has been determined, the bias error contributions can be compensated for in temperature change measurements of the heated portion of the tissue mass, as performed in steps S55–S56.

In step S51, the bias temperature field is measured in a number of portions of a tissue mass that are not being heated ("unheated portions") located in a neighborhood of the heated portion. Although it is contemplated within the scope of the invention to measure the bias temperature change in as few as a single unheated portion, it is preferred to measure the bias temperature changes for a plurality of unheated portions to more accurately characterize the bias temperature field.

Towards this end, in order to estimate a linear bias field, the bias temperature change (or simply "bias") of at least two, and preferably three unheated portions of the tissue mass at different locations are necessary, preferably with the measured locations as distant as possible from one another. More preferably, the bias is measured for more than three unheated portions to provide a more accurate characterization of the bias temperature field.

Referring also to FIG. 4, one preferred approach is to measure the bias at four points 24 roughly forming corners of a rectangular region 20, and at four points 26 near the middle of each side of the region 20. Preferably, the selected points 24, 26 are displaced from the actual borders of the region 20, both to allow for an "averaging neighborhood" around the measured point and to avoid boundary transients. For example, the selected points 24, 26 may be spaced about 20 pixels away from the boundary of the region 20.

The bias for each of the selected unheated portions 24, 26 may be determined by measuring a single image pixel at each portion. Alternatively, in order to reduce the effects of random local noise, the bias for the selected portions 24, 26 may be determined by measuring a respective plurality of pixels located immediately adjacent to each portion. For example, a bias of a 5×5 block of pixels surrounding each portion 24, 26 may be measured. The mean measurement of the surrounding pixels is then computed and used as the temperature measurement for the corresponding unheated portion. As will be apparent to those skilled in the art, any number of pixels may be used, depending on the desired accuracy of the error compensation process versus the added system complexity. In alternative embodiments, another noise reduction algorithm may be used in place of using the mean measurement, such as taking the median of the measurements of the surrounding pixels. The median is particularly effective because it completely ignores the effects of "noisy" outlying locations.

In step S52, the bias temperature change reading that was determined for each unheated portion in step S51 is compared to a threshold. Measurements that differ too greatly from an expected actual background temperature (e.g., 37° C. for human subjects) are discarded. The values of the thresholds used can be set theoretically, e.g., to 4° C. below and above the expected bias temperature change.

Alternatively, the thresholds may be set based on preceding measurements performed over an entire image. For example, a histogram of samples of all the pixel values throughout the region can be made, and values of the $20^{TH}$ and $80^{TH}$ percentiles of the population may be used as the lower and upper thresholds. Optionally, the deviation of these statistical values from their mean may be multiplied by predetermined factors using, for example, the following formulas:

$$TH_{LO}=P_{20}-K_{LO}*(Mean-P_{20})$$

$$TH_{HI}=P_{80}-K_{HI}*(P_{80}-Mean)$$

where $TH_{LO}$ and $TH_{HI}$ are the low and high thresholds, respectively; $P_{20}$ and $P_{80}$ are the values of the $20^{TH}$ and $80^{TH}$ percentile samples from the histogram, respectively; $K_{LO}$ and $K_{HI}$ are the predetermined factors for the low and high thresholds, respectively, and "Mean" is the mean of all the samples in the histogram.

In step S52, the standard deviation of the temperature of the unheated portions within the block of pixels may also be computed. Samples of the temperature in blocks where the standard deviation exceeds a selected threshold, e.g., 1–5° C., might be rejected as they are measured at locations that are "too noisy," or at locations where there is large magnetic field non-uniformity due to blood flow or any other reason.

In alternative embodiments, instead of applying a threshold test a in step S52 to the temperature obtained in step S51 for each selected portion, a threshold test may be applied on a pixel-by-pixel basis for each individual pixel. In these embodiments, before any one pixel is processed by the noise reduction algorithm in step S51, it is compared against an upper and lower threshold and discarded if it falls outside those thresholds. The noise reducing computation (e.g., mean, median, etc.) for each portion is then computed using only those pixels that have not been discarded.

In step S53, bias temperature measurements for portions too close to the heated portion 22 are discarded, i.e., if any one of the selected unheated portions 24, 26 are closer than a maximally possible dimension of the heated portion 22, e.g., about 20 mm. In some embodiments, measurement readings from adjacent or "too-close" unheated portions may be replaced by bias measurements from other unheated portions that are further away from the heated portion 22. Of course, in situations where the position of the heated portion 22 is not known in advance, e.g., while in system calibration stages, this step may be skipped. In such situations, it is preferable to use a large block of pixels in step S51, and to process those pixels using a median. As long as the heated portion 22 is significantly smaller than half of the filtering neighborhood, the pixels that are being heated will be ignored by the median. Notably, precise temperature measurements are not usually required while in system calibration stage. Hence, the issue of bias field estimation when the position of heating cannot be predicted accurately is of limited importance.

In step S54, the background temperature measurements from all portions that were not eliminated in steps S52 and S53 are used to estimate the parameters of the bias temperature field. Because the bias temperature field is approximately linear throughout a local region in the vicinity of the portion being heated, the following expression may be used to describe the bias temperature change throughout a map of that local region:

$$T_{BIAS}(x,y)=A+Bx+Cy.$$

where A, B, and C are constants, and $T_{BIAS}$ is the computed bias value for any given location (x,y). As this expression involves three unknowns, three measurements of the field at three different locations are sufficient to yield the values of parameters A, B, and C, provided that the three measurements are not taken along a straight line.

To obtain a better estimation, however, it is preferable to collect a larger number of measurements (as described above in connection with step S51), and to use those measurements to solve for the parameters A, B, and C. Since the expression approximating the bias temperature field is linear, using a least-squares estimation is a suitable way to characterize the field.

Alternative mathematical approaches may also be used to characterize the field, as will be appreciated by persons skilled in the art. For example, a non-linear model of the bias field map may be used (e.g., with a quadratic dependence), and solutions for parameters that describe the field may be found using, for example, iterative schemes of least-squares estimation. These approaches obviously require more measurement points, e.g. at least 6 for field map with quadratic dependence.

With the bias temperature field characteristic determined, in step S55, a temperature change measurement is made for a pixel located in the heated portion of the tissue mass. Alternatively, a temperature change measurement may be made for each pixel in a block located in the immediate vicinity of the portion being heated, and processed to eliminate random noise, e.g., by forming the mean or median from a 5×5 block of pixels.

In step S56, the temperature change measurement for the heated portion is adjusted to compensate for the value of the bias temperature field that exists at the location of the heated portion. This is preferably accomplished by computing the value of the bias temperature field that exists at each point of the measured volume based on the parameters that describe the field (determined in step S54), and subsequently subtracting the computed value from the bias temperature measurement for that point. The corrected temperature measurement at any location (x,y) in the map can be expressed by the following equation:

$$T_{BEST\text{-}ESTIMATE}(x,y)=T_{MEASURED}(x,y)-T_{BIAS}(x,y)$$

where $T_{MEASURED}$ is the value measured directly from the MR image, $T_{BIAS}$ is the bias value computed for the location of interest based on the map of the field, and $T_{BEST-ESTIMATE}$ is the final estimate for the actual temperature change at the location of interest. When a linear model is being used as the temperature map, this is equivalent to the following, for a point located at position (x,y):

$$T_{BEST-ESTIMATE} = T_{MEASURED} - (A+Bx+Cy)$$

The expression {Ai+Bi*x+Ci*y} can alternately be used, where the "i" subscript refers to a counter running over each of the points in the image depicting the temperature filled within the measured volume. The computation of the entire temperature bias field is useful to insure that the bias "temperature change" throughout the field (i.e., a "cold temperature background") is what would be expected.

The above-described embodiments advantageously provide a more accurate temperature change measurements of a heated portion of a tissue mass during a thermal treatment procedure, which allows for more accurate control in verifying that sufficient heat is delivered to the target tissue, while reducing the risks associated with overheating of near-field healthy tissue.

It will be appreciated by those skilled in the art that the above-described processes are preferably implemented by a suitably programmed image processor, e.g., a computer or microprocessor associated with a MRI guided thermal treatment system. The program, for example, may be stored on any suitable data storage media including, for example, hard drives, floppy disks, CD-ROMs, RAM, ROM, EPROM, EEPROM, etc. Optionally an existing image processor may be reprogrammed to implement the above-described processes.

While the invention has been described and explained in the context of the preferred embodiments discussed above, it will be understood by those skilled in the art that various changes may be made to those embodiments, and various equivalents may be substituted, without departing from the scope of the invention as defined only by the appended claims and their equivalents.

What is claimed is:

1. A method of determining a change in temperature of a heated portion of a tissue mass using magnetic resonance imaging techniques, comprising:
   measuring an apparent change in temperature of the heated portion;
   measuring an apparent change in temperature of an unheated portion of the mass located in a neighborhood of the heated portion; and
   adjusting the measured apparent change in temperature of the heated portion based at least in part on the measured apparent change in temperature of the unheated portion.

2. The method of claim 1, wherein the apparent change in temperatures of the respective heated and unheated portions are measured by
   for each portion, measuring a characteristic related to temperature before the heated portion is heated,
   for each portion, measuring the same characteristic after the heated portion is heated, and
   for each portion, deriving an apparent temperature change value based on a change, if any, in the measured characteristic.

3. The method of claim 2, wherein the measured characteristic is the phase of an electromagnetic signal emitted from the respective portion, and wherein the apparent temperature change value is derived from a phase shift in the respective signal.

4. The method of claim 1, wherein the adjusting step comprises
   subtracting the measured apparent temperature change of the unheated portion from the measured apparent temperature change of the heated portion.

5. A method of determining a change in temperature of a heated portion of a tissue mass using magnetic resonance techniques, comprising:
   measuring an apparent temperature change of each of a plurality of unheated portions of the mass located in a neighborhood of the heated portion;
   measuring an apparent temperature change of the heated portion; and
   adjusting the measured apparent change in temperature of the heated portion based at least in part on the measured apparent change in temperatures of the unheated portions.

6. The method of claim 5, wherein the apparent change in temperatures of the heated portion and of each of the unheated portions are measured by
   for each portion, measuring a characteristic related to temperature before the heated portion is heated,
   for each portion, measuring the same characteristic after the heated portion is heated, and
   for each portion, deriving an apparent temperature change based on a change, if any, in the measured characteristic.

7. The method of claim 5, wherein the plurality of unheated portions comprises four unheated portions, the unheated four portions roughly comprising four corners of a rectangle, wherein the heated portion is located within the rectangle.

8. The method of claim 5, each unheated portion comprising a plurality of pixels when imaged, wherein the apparent temperature change of each unheated portion is determined by measuring an apparent temperature change value for each pixel of the respective portion, and computing a mean of the values.

9. The method of claim 5, each unheated portion comprising a plurality of pixels when imaged, wherein the apparent temperature change of each unheated portion is determined by measuring an apparent temperature change value for each pixel of the respective portion, and computing a median of the values.

10. The method of claim 5, the adjusting step comprising
    discarding an apparent temperature change measurement for any unheated portion if the measurement exceeds a predetermined upper threshold value, or is below a predetermined lower threshold value.

11. The method of claim 5, further comprising
    calculating a standard deviation of the apparent temperature change measurements of the unheated portions, and
    in the adjustment step, discarding an apparent temperature change measurement for any unheated portion if the measurement exceeds the calculated standard deviation.

12. The method of claim 5, the adjusting step comprising
    discarding an apparent temperature change measurement for any unheated portion located directly adjacent to the heated portion.

13. The method of claim 5, the adjusting step comprising
    discarding an apparent temperature change measurement for any unheated portion located within a predetermined distance from the heated portion.

14. The method of claim 13, wherein the predetermined distance, when imaged, is about twenty pixels.

15. A method of determining a temperature of a heated portion of a tissue mass using magnetic imaging techniques, comprising:

(a) measuring an apparent temperature change of each of a plurality of unheated portions of the mass located in a neighborhood of the heated portion;

(b) determining a characteristic of a bias temperature field based on the apparent temperature changes measured in step (a);

(c) measuring an apparent temperature change of the heated portion;

(d) calculating a bias temperature change value corresponding the position of the heated portion based on the bias temperature field characteristic determined in step (b); and (e) adjusting the temperature change measurement made in step (c) based on the bias temperature change value calculated in step (d).

16. The method of claim 15, wherein, in step (a), apparent temperature changes of at least three unheated portions of the mass are measured, and wherein, in step (b), the characteristic of the bias temperature field is determined by calculating parameters A, B, and C for the expression $T_{BIAS}(X,Y)=A+Bx+Cy$ based on the measurements made in step (a) and the respective x,y positions in an magnetic resonance image of the at least three unheated portions measured in step (a).

17. The method of claim 16, wherein, in step (d), the bias temperature change value corresponding to the position of the heated portion is calculated based on the expression $T_{BIAS}(x,y)=A+Bx+Cy$ using the parameters A, B, and C calculated in step (b) and the x,y position of the heated portion in the image, and wherein, in step (e), the temperature change measurement is adjusted by subtracting the bias temperature change value calculated in step (d) from the apparent temperature measurement made in step (c).

18. A system for monitoring a change in temperature of a heated portion of a tissue mass using magnetic resonance imaging techniques, the system configured to:

measure an apparent change in temperature of the heated portion;

measure an apparent change in temperature of an unheated portion of the tissue mass located in a neighborhood of the heated portion; and adjust the measured apparent change in temperature of the heated portion based at least in part on the measured apparent change in temperature of the unheated portion.

19. The system of claim 18, wherein the apparent change in temperatures of the respective heated and unheated portions are measured by for each portion, measuring a characteristic related to temperature before the heated portion is heated, for each portion, measuring the same characteristic after the heated portion is heated, and for each portion, deriving an apparent temperature change value based on a change, if any, in the measured characteristic.

20. The system of claim 19, wherein the measured characteristic is the phase of an electromagnetic signal emitted from the respective portion, and wherein the apparent temperature change value is derived from a phase shift in the respective signal.

21. The system of claim 18, wherein the measured apparent change in temperature of the heated portion is adjusted by subtracting the measured apparent temperature change of the unheated portion from the measured apparent temperature change of the heated portion.

22. A system for monitoring a change in temperature of a heated portion of a tissue mass using magnetic resonance imaging techniques, the system configured to:

measure an apparent temperature change of each of a plurality of unheated portions of the tissue mass located in a neighborhood of the heated portion;

measure an apparent temperature change of the heated portion; and adjust the measured apparent change in temperature of the heated portion based at least in part on the measured apparent change in temperatures of the unheated portions.

23. The system of claim 22, wherein the apparent change in temperatures of the heated portion and of each of the unheated portions are measured by for each portion, measuring a characteristic related to temperature before the heated portion is heated, for each portion, measuring the same characteristic after the heated portion is heated, and for each portion, deriving an apparent temperature change based on a change, if any, in the measured characteristic.

24. The system of claim 22, wherein the plurality of unheated portions comprises four unheated portions, the unheated four portions roughly comprising four corners of a rectangle, wherein the heated portion is located within the rectangle.

25. The system of claim 22, each unheated portion comprising a plurality of pixels when imaged, wherein the apparent temperature change of each unheated portion is determined by measuring an apparent temperature change value for each pixel of the respective portion, and computing a mean of the values.

26. The system of claim 22, each unheated portion comprising a plurality of pixels when imaged, wherein the apparent temperature change of each unheated portion is determined by measuring an apparent temperature change value for each pixel of the respective portion, and computing a median of the values.

27. The system of claim 22, wherein the apparent change in temperature of the heated portion is adjusted by discarding an apparent temperature change measurement for any unheated portion if the measurement exceeds a predetermined upper threshold value, or is below a predetermined lower threshold value.

28. The system of claim 22, the system further configured to calculate a standard deviation of the apparent temperature change measurements of the unheated portions, and in adjusting the measured apparent temperature change of the heated portion, discard an apparent temperature change measurement for any unheated portion if the measurement exceeds the calculated standard deviation.

29. The system of claim 22, wherein the measured apparent change in temperature of the heated portion is adjusted by discarding an apparent temperature change measurement for any unheated portion located directly adjacent to the heated portion.

30. The system of claim 22, wherein the measured apparent change in temperature of the heated portion is adjusted by discarding an apparent temperature change measurement for any unheated portion located within a predetermined distance from the heated portion.

31. The system of claim 30, wherein the predetermined distance, when imaged, is about twenty pixels.

32. A system for determining a temperature of a heated portion of a tissue mass using magnetic imaging techniques, the system configured to:

measure an apparent temperature change of each of a plurality of unheated portions of the mass located in a neighborhood of the heated portion;

determine a characteristic of a bias temperature field based on the measured apparent temperature changes of the plurality of unheated portions;

measure an apparent temperature change of the heated portion;

calculate a bias temperature change value corresponding the position of the heated portion based on the determined bias temperature field characteristic; and adjust the temperature change measurement of the heated portion based on the calculated bias temperature change value.

33. The system of claim 32, wherein apparent temperature changes of at least three unheated portions of the mass are measured, and wherein the characteristic of the bias temperature field is determined by calculating parameters A, B, and C for the expression $$T_{BIAS}(x,y) = A + Bx + Cy$$

based on the temperature change measurements of the unheated portions and the respective x,y positions in an magnetic resonance image of the at least three unheated portions.

34. The system of claim 33, wherein the bias temperature change value corresponding to the position of the heated portion is calculated based on the expression $T_{BIAS}(x,y)=A+Bx+Cy$ using the calculated parameters A, B, and C and the x,y position of the heated portion in the image, and wherein the temperature change measurement of the heated portion is adjusted by subtracting the calculated bias temperature change value from the apparent temperature measurement.

* * * * *

UNITED STATES PATENT AND TRADEMARK OFFICE
CERTIFICATE OF CORRECTION

PATENT NO. : 6,559,644 B2
DATED : May 6, 2003
INVENTOR(S) : David Froundlich

It is certified that error appears in the above-identified patent and that said Letters Patent is hereby corrected as shown below:

Title page,
Item [12], delete "Froundlich et al." and insert therefore -- Freundlich et al. --.
Item [75], Inventors, delete "David Froundlich" and insert -- David Freundlich --.

Signed and Sealed this

Sixth Day of September, 2005

JON W. DUDAS
*Director of the United States Patent and Trademark Office*